(12) United States Patent
Lai et al.

(10) Patent No.: US 8,878,297 B2
(45) Date of Patent: Nov. 4, 2014

(54) ESD PROTECTION CIRCUIT

(71) Applicant: GLOBALFOUNDRIES Singapore Pte. Ltd., Singapore (SG)

(72) Inventors: Da-Wei Lai, Singapore (SG); Ming Li, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/967,370

(22) Filed: Aug. 15, 2013

(65) Prior Publication Data
US 2014/0084366 A1    Mar. 27, 2014

Related U.S. Application Data

(60) Provisional application No. 61/705,159, filed on Sep. 25, 2012.

(51) Int. Cl.
*H01L 23/62* (2006.01)
*H01L 29/78* (2006.01)

(52) U.S. Cl.
CPC .................... *H01L 29/7816* (2013.01)
USPC ............. 257/355; 257/335; 257/E29.256

(58) Field of Classification Search
CPC .................................................. H01L 29/7816
USPC .................................. 257/335, 355, E29.256
See application file for complete search history.

(56) References Cited

U.S. PATENT DOCUMENTS 8,704,307 B2 *   4/2014  Kim .............................. 257/355
2013/0187218 A1 *   7/2013  Lai et al. ....................... 257/328

* cited by examiner

*Primary Examiner* — Thien F Tran
(74) *Attorney, Agent, or Firm* — Horizon IP Pte Ltd

(57) ABSTRACT

A device having a substrate defined with a device region is presented. The device region includes an ESD protection circuit having a transistor. The transistor includes a gate having first and second sides, a first diffusion region adjacent to the first side of the gate and a second diffusion region displaced away from the second side of the gate. The device includes a first device well which encompasses the device region and a second device well disposed within the first device well. The device further includes a drift well which encompasses the second diffusion region of which edges of the drift well do not extend below the gate and is away from a channel region, and a drain well which is disposed under the second diffusion region and extends below the gate.

20 Claims, 3 Drawing Sheets

ESD PROTECTION CIRCUIT

BACKGROUND

Traditional lateral diffused metal oxide semiconductor (LDMOS) which is used as ESD protection device in high voltage processes has some inherent poor characteristics, such as "strong snapback effect or base push out", which negatively affect or degrade its ESD performance. These negative characteristics affect the operation of the integrated circuit (IC) rendering it defective.

The disclosure is directed to a compact ESD protection device with robust ESD performance to avoid damaging internal circuits and at the same time having high latch up immunity.

SUMMARY

Embodiments generally relate to semiconductor devices. In one embodiment, a device is disclosed. The device includes a substrate defined with a device region. The device region includes an ESD protection circuit having a transistor. The transistor includes a gate having first and second sides. A first diffusion region is disposed in the device region adjacent to the first side of the gate and a second diffusion region is disposed in the device region displaced away from the second side of the gate. The first and second diffusion regions include dopants of a first polarity type. The device includes a first device well which encompasses the device region and a second device well which is disposed within the first device well. The device further includes a drift well which encompasses the second diffusion region. Edges of the drift well do not extend below the gate and is away from a channel region. The device also includes a drain well having dopants of the first polarity type which encompasses the second diffusion region and extends below the gate.

In another embodiment, a device is presented. The device includes a substrate defined with a device region. The device region includes an ESD protection circuit having a transistor. The transistor includes a gate having first and second sides, a first diffusion region adjacent to the first side of the gate and a second diffusion region displaced away from the second side of the gate. The device includes a first device well which encompasses the device region and a second device well which is disposed within the first device well. The device further includes a drift well which encompasses the second diffusion region of which edges of the drift well do not extend below the gate and is away from a channel region, and a drain well which is disposed under the second diffusion region and extends beyond the drift well.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. ESD circuits are provided for the devices. For example, the ESD circuits may be used in high voltage applications or devices. The ESD circuits, for example, may be used in 14~17V applications. The ESD circuits as will be described below, are suitable for use in, for example, devices produced under the 0.18 µm 16V Bipolar CMOS DMOS (BCD) process. Other suitable types of processes may also be useful. ESD circuits, for example, are activated during an ESD event to dissipate ESD current. The devices, for example, may be any type of semiconductor devices, such as integrated circuits (ICs). Such devices, for example, can be incorporated into standalone devices or ICs, such as microcontrollers or system on chips (SoCs). The devices or ICs can be incorporated into or used with, for example, electronic products, such as speakers, computers, cell phones, and personal digital assistants (PDAs).

Figure 1:
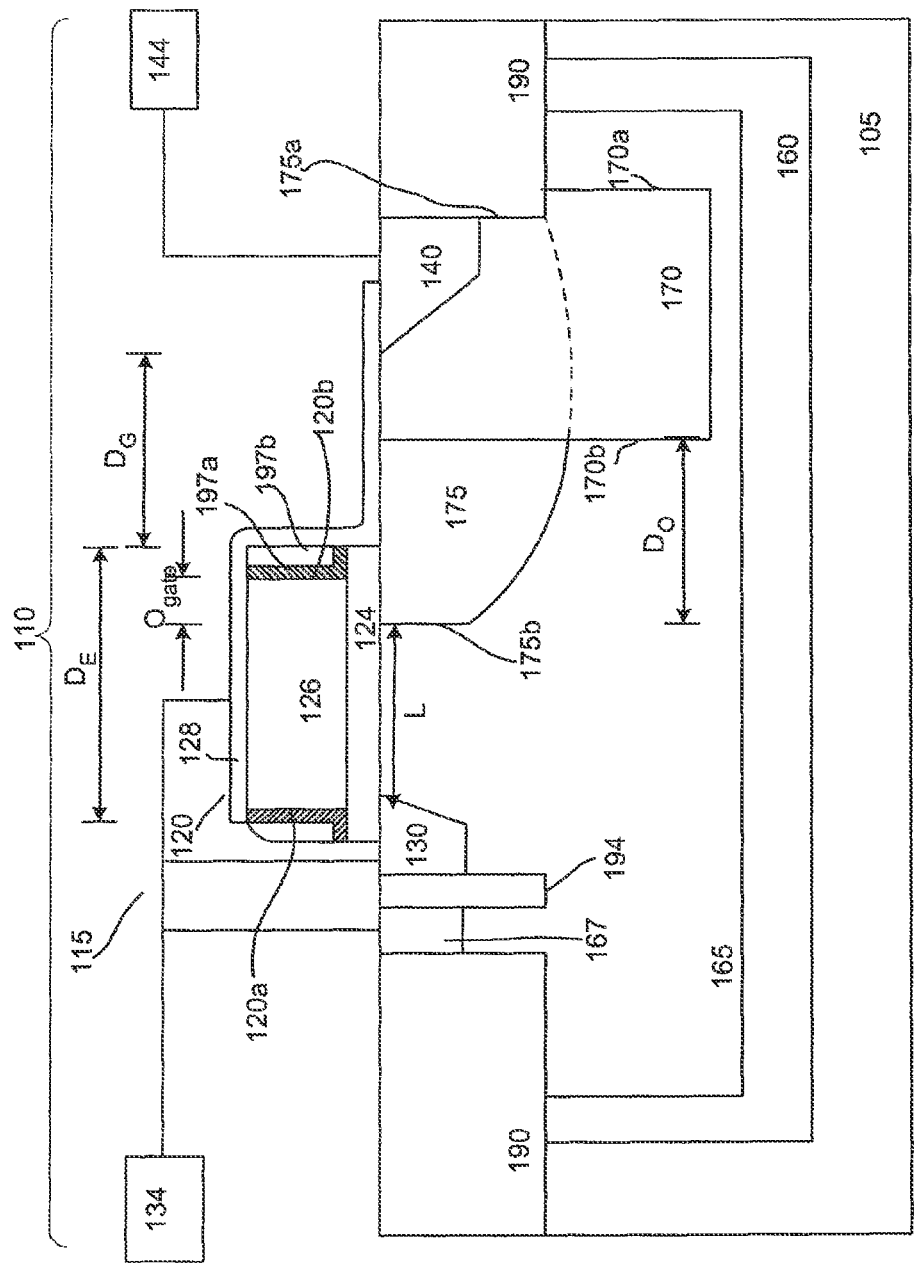
FIG. 1 shows cross-sectional view of an embodiment of a device.

FIG. 1 shows a cross-sectional view of an embodiment of a device 100. As shown, a substrate 105 is provided. The substrate, for example, is a semiconductor substrate, such as a silicon substrate. In one embodiment, the substrate may be a p-type doped substrate. For example, the p-type doped substrate is a lightly p-type doped substrate. Other types of semiconductor substrates, including doped with other types of dopants or concentration or undoped, may also be useful. For example, the substrate may be a silicon germanium, germanium, gallium arsenide, or crystal-on-insulator (COI) such as silicon-on-insulator (SOI). The substrate can be a doped substrate.

The device may include doped regions or wells having different dopant concentrations. For example, the device may include heavily doped, intermediate doped and lightly doped regions. The doped regions may be designated by $x^-$, $x$ and $x^+$, where x indicates the polarity of the doping, such as p for p-type or n for n-type, and:

$x^-$=lightly doped;
$x$=intermediately doped; and
$x^+$=heavily doped.

A lightly doped region may have a dopant concentration of less than about $5E13/cm^3$. For example, a lightly doped region may have a dopant concentration of about $1E11/cm^3$-$5E13/cm^3$. An intermediate doped region may have a dopant concentration from about $5E13$-$5E15/cm^3$. For a heavily doped region, it may have a dopant concentration of more than about $5E15/cm^3$. For example, a heavily doped region may have a dopant concentration from about $5E15\,cm^3$-$9E15/cm^3$. Other concentrations of the different types of doped regions may also be useful. P-type dopants may include boron (B), aluminum (Al), indium (In) or a combination thereof, while n-type dopants may include phosphorus (P), arsenic (As), antimony (Sb) or a combination thereof.

As shown, the device includes a device region 110 defined on the substrate. The substrate may also include regions for other types of circuitry, depending on the type of device or IC. For example, the device may also include regions (not shown) for intermediate voltage (IV) and low voltage (LV) devices as well as an array region for memory devices. A device isolation region 190 may be provided for isolating or separating the device region from other device regions (not shown) on the substrate. In one embodiment, the device isolation region surrounds the device region. The isolation region, for example, is a shallow trench isolation (STI) region. Other types of isolation regions may also be employed. For example, the isolation region may be a deep trench isolation (DTI) region. The isolation region, for example, extends to a depth of about 3200 Å for a STI region. Providing isolation regions which extend to other depths, such as 0.5-10 μm for DTI regions, may also be useful. In one embodiment, the width of the isolation region is about 0.3 μm. Providing isolation regions having different depths and widths may also be useful. The dimensions, for example, may depend on isolation requirements.

The device region includes an ESD protection circuit 115. The ESD protection circuit, in one embodiment, is a lateral diffused transistor. For example, the ESD protection circuit is a lateral diffused metal oxide semiconductor (LDMOS) transistor. As shown, the device region includes one LDMOS transistor. Providing more than one LDMOS transistors may also be useful.

A first doped well 160 is disposed in the substrate in the device region. The first doped well, as shown, encompasses the complete device region. For example, the first doped well serves as a first device well which extends from the bottom of the isolation region between the inner and outer edges of the isolation region. Providing the first doped well which extends from about an outer edge of the device isolation region may also be useful. In one embodiment, the first doped well serves as an isolation well. For example, the first well isolates the ESD protection circuit from the substrate. The first doped well should be sufficiently deep to serve as an isolation well. The depth of the first doped well, for example, may be about 6-8 μm. Other suitable depth dimensions may also be useful.

The first doped well includes first polarity type dopants. In one embodiment, the first well is lightly doped with first polarity type dopants. For example, the dopant concentration of the first doped well may be about 1E12-5E13 cm$^3$. Providing a first doped well having other dopant concentrations may also be useful. In one embodiment, the first polarity type is n-type. For example, the first well may be n$^-$ well for n-type device. Providing p-type as the first polarity type is also useful. For example, a p$^-$ well may be used for a p-type device.

A gate 120 of the transistor is disposed on the surface of the substrate in the device region. A gate may be referred to as a finger. The gate includes a gate electrode 126 disposed over a gate dielectric 124. In one embodiment, the gate electrode is a polysilicon gate electrode. Other suitable types of gate electrode materials may also be useful. As for the gate dielectric, it includes a silicon oxide. Other suitable types of gate dielectric materials may also be useful. In one embodiment, the gate is similar to gates used for medium voltage devices. For example, the thicknesses of the gate electrode and gate dielectric may be similar to that of the medium voltage devices. The thickness of the gate electrode, for example, is about 2000 Å while the thickness of the gate dielectric, for example, is about 130 Å. Other suitable configurations and thicknesses of gates may also be useful.

The gate may be a gate conductor which forms gates of multiple transistors. For example, the gate conductor may traverse a plurality of device regions separated by isolation regions. The pluralities of transistors have a common gate formed by the gate conductor. Other configurations of gate conductors may also be useful.

The gate is disposed between first and second source/drain (S/D) regions 130 and 140. The S/D regions are first polarity type doped regions disposed in the substrate. The S/D regions are, for example, heavily doped first polarity type regions. For example, the S/D regions may have a depth of about 0.1-0.4 μm. Other suitable depths may also be useful. The S/D regions may be similar to those of other transistors of the device. In one embodiment, the first S/D region 130 is a source region and the second S/D region 140 is a drain region of the transistor.

The first S/D region is disposed adjacent to a first side 120a of the gate. In one embodiment, the gate overlaps the first S/D region 130. For example, the first side of the gate overlaps the first S/D region. The amount of overlap should be sufficient for the first S/D region to be in communication with a channel of the transistor under the gate. The amount of overlap is, for example, about 0.1-0.5 μm. Overlapping the first S/D region by other amounts may also be useful. In one embodiment, the gate overlaps a lightly doped (LD) region of the first S/D region. Other configurations of the first S/D region may also be useful. As for the second S/D region 140, it is displaced by a distance $D_G$ laterally away from a second side 120b of the gate. The lateral displacement $D_G$ may, in some instances, correspond to the drift distance. $D_G$, for example, may be about 1~10 μm. $D_G$, for example, may include any other suitable distances which depend on general design rules of respective foundries.

Sidewalls of the gate may be provided with dielectric spacers. The dielectric spacers, for example, may be silicon oxide spacers. Other types of dielectric materials may also be useful, such as silicon nitride or a combination of dielectric materials or layers. For example, the spacers may be composite spacers 197a-b as shown in FIG. 1. The spacers may facilitate forming the lightly doped and S/D regions. For example, the lightly doped region is formed prior to spacer formation while the first S/D region is formed after spacer formation. Other configurations of spacers may also be useful. For example, the spacer may be a single spacer. In some cases, the transistor may also include a halo region. The halo region is a second polarity doped region abutting the lightly doped and first S/D regions under the gate.

In one embodiment, no drift isolation region is provided between the gate and the second S/D region. For example, as shown in FIG. 1, the transistor is devoid of a drift isolation region. Without the drift isolation region, the ESD device trigger voltage may be reduced to a lower voltage, for example, 22V. In the case where no drift isolation region is provided, a silicide block 128 is provided on the substrate. The silicide block prevents formation of silicide to reduce risk of shorting of the silicide contact (not shown) on the drain region from shorting with the gate. The silicide block is a dielectric liner. For example, the dielectric liner is a silicon oxide liner. In one embodiment, the silicide block is disposed on a top surface of the gate, overlapping the gate by a distance $D_E$. The distance $D_E$, for example, is equal to about the length of the gate. For example, $D_E$ is about 1 μm. $D_E$, for example, may also include any other suitable distances which depend on general design rules of respective foundries. Providing a portion of the silicide block which overlaps the gate by a distance $D_E$ is advantageous as it effectively prevents formation of silicide in the underlying region and effectively prevents current to flow in the horizontal direction, leading to better ESD performance. The silicide block lines the top of the gate and extends partially over the drain region as shown in FIG. 1. Other configurations for the silicide block may also be useful. For example, the silicide block may extend over the entire top surface of the gate and the first S/D region. Such configuration improves the holding voltage.

A second well 165 is disposed in the substrate. The second well may be disposed in the device region. For example, the second well is disposed within the first well. The second well serves as a body well for the transistors. The second device well includes second polarity dopants for a first polarity type device. For example, the second device well includes p-type dopants for an n-type device or n-type dopants for a p-type device. The second device well may be lightly (x⁻) or intermediately (x) doped with first polarity type dopants. For example, the dopant concentration of the second well may be about $1E12{\sim}5E13/cm^3$. Other dopant concentration for the second device well may also be useful.

The body well at least encompasses the first S/D regions and a part of the gate. As shown, the body well encompasses the first and second S/D regions. Other configurations of the second well may also be useful. The body well, for example, extends from the bottom of the isolation region between the inner and outer edges of the isolation region. Providing the second well which extends from about an inner edge of the device isolation region may also be useful. A depth of the second well is shallower than the first well. For example, the depth of the second well is about 2-5 μm. Providing the second well with other depths may also be useful.

The second well, in one embodiment, is provided with a second well contact 167 for biasing the second well. The second well contact is a heavily doped region, similar to the S/D regions. For example, a depth of the second well contact is shallower than a depth of the device isolation region and the second well contact is in communication with the second well. The dopant concentration of the second well contact may be about $5E15{\sim}9E15/cm^3$. Other suitable concentration ranges may also be useful. The second well contact has the same polarity type as the second well. For example, the second well contact 167 is a second polarity type doped region.

In one embodiment, an isolation region 194 may be provided to separate the second well contact 167 with the first S/D region 130. The isolation region 194 may be STI region. For example, the isolation region may be similar to the device isolation regions. Other types or configurations of isolation regions may also be useful.

Metal silicide contacts (not shown) may be formed on the various contact regions. For example, metal silicide contacts may be provided over the S/D regions and the second well contact. The silicide contacts, for example, may be nickel-based contacts. Other types of metal silicide contacts may also be useful. For example, the silicide contacts may be cobalt silicide (CoSi) contacts. The silicide contacts may be about 100-500 Å thick. Other thickness of silicide contacts may also be useful. The silicide contacts may be employed to reduce contact resistance and facilitate contact to the back-end-of-line metal interconnects.

In one embodiment, a third well 170 is provided. The third well is disposed in the substrate within the second well. For example, a depth of the third well is shallower than a depth of the second well. The third well serves as a drift well. In one embodiment, the drift well encompasses the second S/D region 140 and is configured or narrowed so that the edge of the drift well does not extend below the gate and is away from a channel region.

In one embodiment, the depth or bottom of the third well is below the isolation regions. The depth of the third well may be about 1~3 μm. Other depths may also be useful. The depth, for example, may depend on the design voltage of the device. The drift well, for example, extends from a bottom of the device isolation region 190 which is adjacent to the second S/D region 140 towards the gate and is spaced apart from the gate. The width of the third well, for example, extends from a first edge 170a to a second edge 170b. The width of the third well, for example, is about 1~10 μm. The third well may also include other suitable width dimensions.

The drift well includes first polarity type dopants. In one embodiment, the dopant concentration of the drift well is lower than the dopant concentration of the drain 140. In one embodiment, the drift well may be lightly (x⁻) or intermediately (x) doped with first polarity type dopants. For example, the dopant concentration of the drift well is about $1E12{\sim}5E13/cm^3$. Other suitable dopant concentrations may also be useful. For example, the dopant concentration may depend on the maximum or breakdown voltage requirement of the device.

In one embodiment, the second well, the first S/D region and gate are commonly coupled to a first terminal 134 of the ESD device. The second S/D region is coupled to a second terminal 144 of the ESD device. For example, the first terminal is a source terminal and the second terminal is a drain terminal. In one embodiment, the second well contact 167 is also coupled to the first or source terminal. The source terminal, for example, is coupled to ground while the drain terminal, for example, is coupled to $V_{DD}$ or I/O pad. Other configurations of terminal connections to the ESD devices may also be useful.

In one embodiment, a fourth well 175 is provided. The fourth well, for example, serves as a second S/D or drain well. In one embodiment, the drain well is disposed within the second well in the substrate and encompasses the second S/D region. The drain well, in one embodiment, is configured or extended so that the second edge 175b of the drain well extends towards and below the gate. In one embodiment, the first edge 175a of the drain well is aligned with or contacts an inner edge of the device isolation region which is adjacent to the second S/D region and the drain well underlaps a portion of the gate, creating a gate overlap region $O_{gate}$. The $O_{gate}$, for example, is between a second edge 175b of the fourth well under the gate and a second side of the gate. In one embodiment, $O_{gate}$ is about 0.1~2 μm. Providing other values of $O_{gate}$ may also be useful. As shown, the distance L between the first S/D region 130 and the fourth well correspond to the channel region of the transistor.

In one embodiment, a depth of the fourth well is shallower than a depth of the third well. For example, the depth of the fourth well is about 0.5~2 μm. Other depth dimensions may also be useful, depending on the breakdown voltage of the device. In one embodiment, the width of the fourth well, in one embodiment, is larger than the width of the second S/D region 140 and third well 170. The drain well 175 includes first polarity type dopants. In one embodiment, the dopant concentration of the drain well is between the second S/D region and drift well. In one embodiment, the drain well may be intermediately (x) doped with first polarity type dopants. For example, the dopant concentration of the drain well is about $5E13{\sim}5E14/cm^3$. Other suitable dopant concentrations may also be useful.

As described, the drift well 170 encompasses the second S/D region 140 and is configured or narrowed so that the edge 170b of the drift well does not extend below the gate and is away from the channel region. In one embodiment, the fourth or drain well 175 is configured or widened so that it is wider than the third or drift well 170. As shown in FIG. 1, the second edge 175b of the drain well, for example, is below and underlaps a portion of the gate while the second edge 170b of the drift well is displaced away from the gate. At least edges of the third and fourth well adjacent to the gate, for example, are separated by a distance. As shown in FIG. 1, the second edge 170b of the third well and the second edge 175b of the fourth well are separated by a distance $D_O$. The distance $D_O$, for example, is about 0.5~5 μm with reference to the edge 175b of the fourth or drain well. The distance $D_O$, for example, may be tuned or varied with reference to the edge 175b of the fourth well 175. Other suitable distances for $D_O$ may also be useful, as long as the second edge 170b of the third well is not too close to the channel region. For example, any suitable distances for $D_O$ may be useful, so long as the second edge of the third well does not extend towards the gate or channel region.

We have discovered that providing the drift well and the drain well with the configuration as described above result in advantages. As described, the drain well 175 and drift well 170 which are disposed below the second S/D region 140 are intermediately doped with first polarity type dopants. This configuration provides higher doping concentration below the second S/D region, enabling major current to flow vertically and deep into the second or body well 165. This produces lateral NPN base width which is wider relative to the channel length. As a result, the holding voltage is increased, leading to improved latch up immunity.

Figure 2:
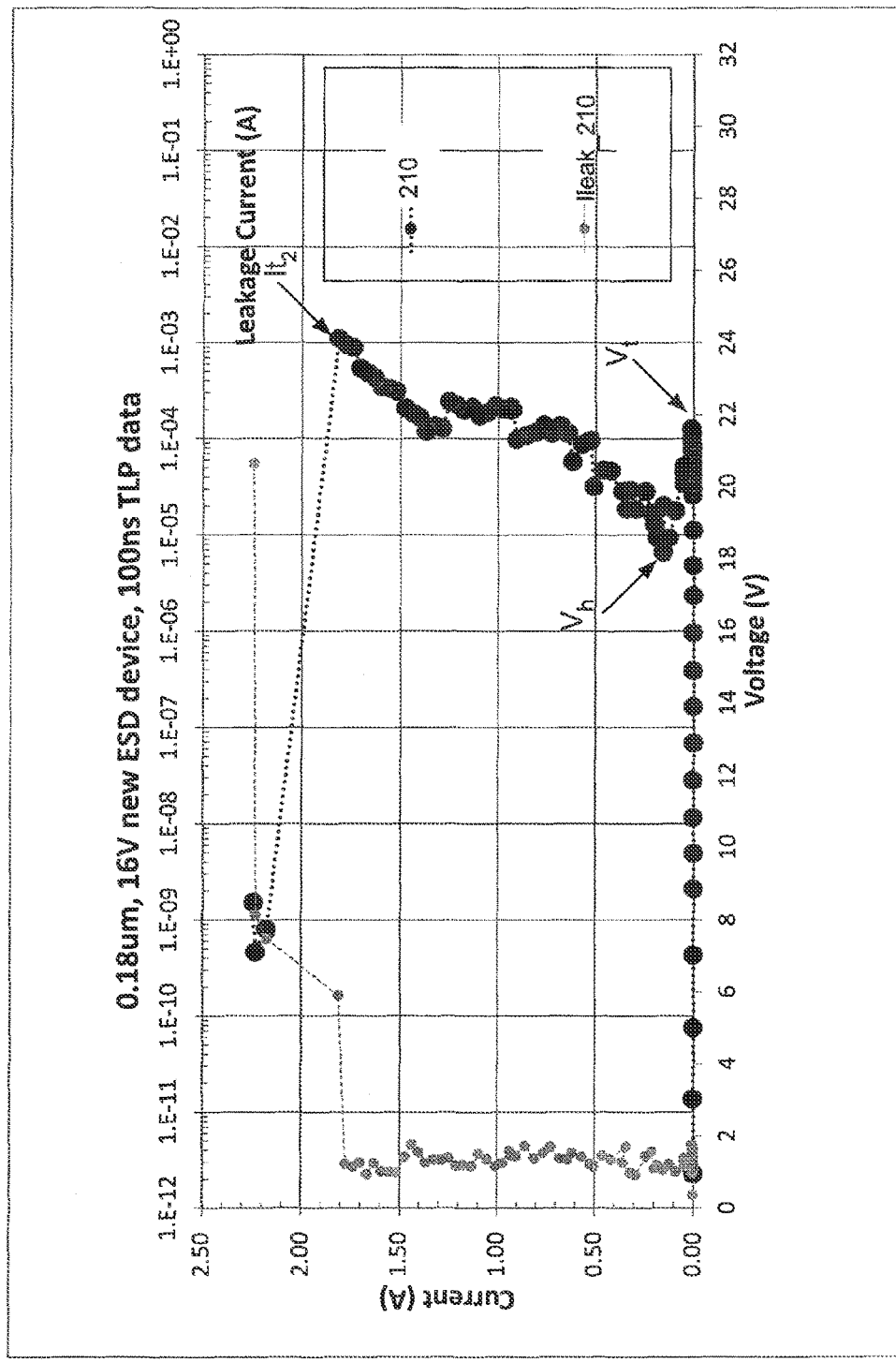
FIG. 2 shows the transmission line pulse (TLP measurement) of an embodiment of a device.
Figure 3:
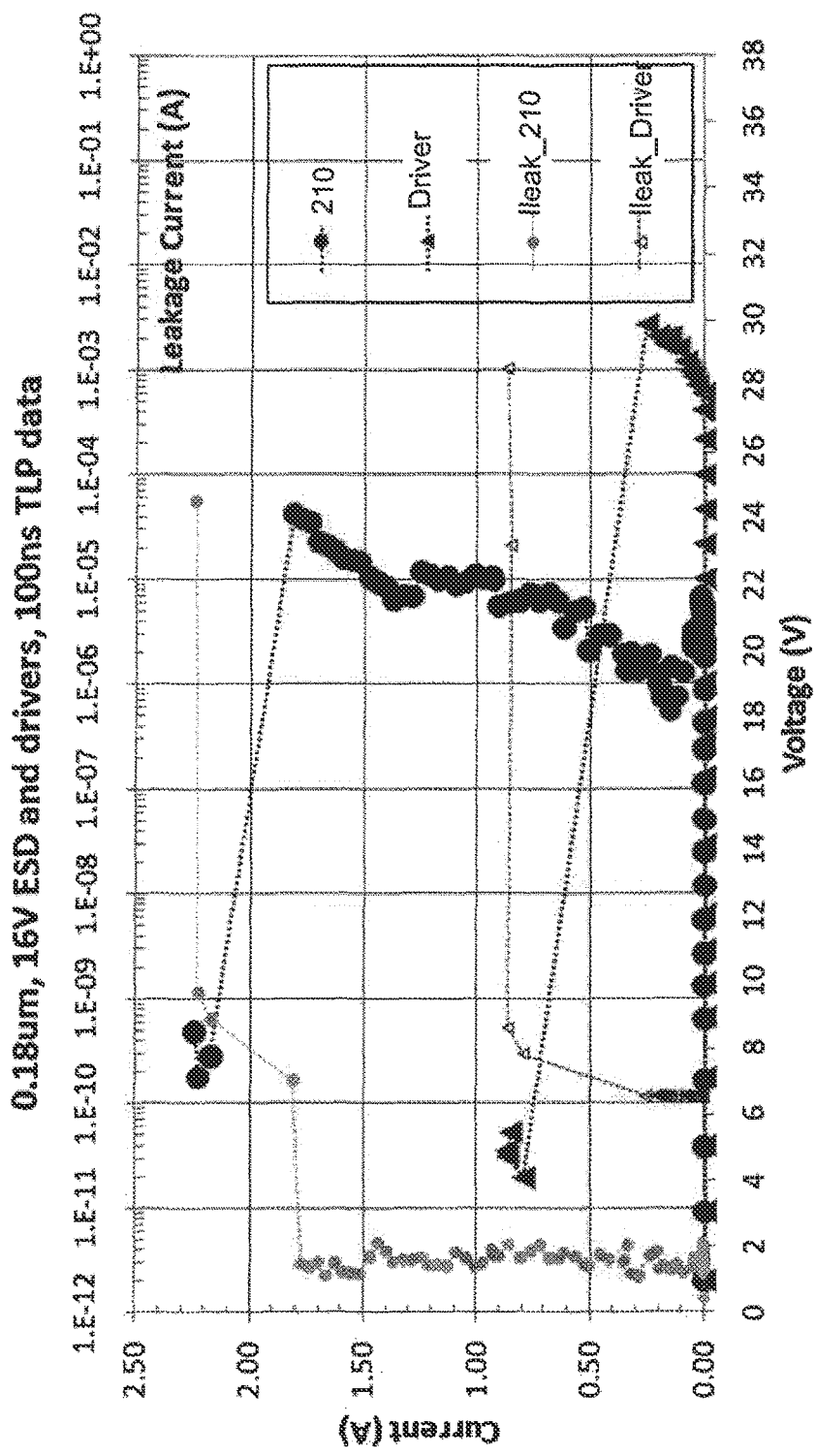
FIG. 3 shows comparison of the TLP measurement of an embodiment of a device and the TLP measurement of a device produced under 14~17V BCD process.

FIG. 2 shows a TLP measurement 210 of the embodiment of the ESD protection circuit as described in, for example, FIG. 1. The embodiment of the ESD protection circuit, as described in FIG. 1, for example, is suitable for use in the 0.18 μm 16V Bipolar CMOS DMOS (BCD) process. As observed in the TLP measurement 210 of the LDMOS, the trigger voltage ($V_t$) is about 22 V while the thermal runaway current ($It_2$) which relates to the ESD performance of the LDMOS is about 1.8 A. In other words, when the device enters the snapback mode around 22 V, the device fails around 1.8 A for a given total width of 600 μm. Moreover, the snapback or holding voltage ($V_h$) of the LDMOS, as shown, is about 18.2 V, which is higher than the operation voltage of 16V. Since the holding voltage is larger than the operation voltage, the device does not suffer latch-up under latch-up testing. As such, the configuration as described above is effective to increase the ESD $It_2$ and $V_h$ capabilities. The increased in $It_2$ means that the device is capable of shunting greater amount of current before failure while the enhanced $V_h$, which is greater than the operation voltage of 16V shows that the latch up phenomena is eliminated. Accordingly, the ESD device based on the configuration above exhibits superior ESD performance and improved latch up immunity. Moreover, since the $V_h$ of the embodiment as described in FIG. 1 is about 18.2V which is higher than the operation voltage of 16V, it is suitable for use in, for example devices produced under the 14~17V BCD process as shown in FIG. 3.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

What is claimed is:

1. A device comprising:
   a substrate defined with a device region, the device region comprises an ESD protection circuit having a transistor, wherein the transistor includes
      a gate having first and second sides,
      a first diffusion region adjacent to the first side of the gate, and
      a second diffusion region displaced away from the second side of the gate, wherein the first and second diffusion regions comprise dopants of a first polarity type;
   a first device well encompasses the device region and a second device well disposed within the first device well;
   a drift well which encompasses the second diffusion region, wherein edges of the drift well do not extend below the gate and is away from a channel region; and
   a drain well having dopants of the first polarity type encompasses the second diffusion region and extends below the gate.

2. The device of claim 1 wherein the first device well comprises dopants of the first polarity type and the second device well comprises dopants of a second polarity type.

3. The device of claim 2 wherein the first polarity type comprises n type and the second polarity type comprises p type.

4. The device of claim 1 wherein the second device well encompasses at least the first diffusion region and a part of the gate.

5. The device of claim 4 wherein the second device well encompasses the gate and the first and second diffusion regions.

6. The device of claim 1 wherein the first device well and the drift well comprise dopants of the first polarity type and the second device well comprises dopants of a second polarity type.

7. The device of claim 6 wherein the first polarity type comprises n type and the second polarity type comprises p type.

8. The device of claim 1 wherein the drift well is narrower than the drain well.

9. The device of claim 1 wherein a first edge of the drift well is below a bottom of a device isolation region adjacent to the second diffusion region and a second edge of the drift well extends beyond the second diffusion region.

10. The device of claim 1 wherein the drain well is shallower than the drift well.

11. The device of claim 1 wherein the drain well comprises a width which is larger than a width of the second diffusion region.

12. A device comprising:
    a substrate defined with a device region, the device region comprises an ESD protection circuit having a transistor, wherein the transistor includes
       a gate having first and second sides,
       a first diffusion region adjacent to the first side of the gate, and
       a second diffusion region displaced away from the second side of the gate;
    a first device well encompasses the device region and a second device well disposed within the first device well;
    a drift well which encompasses the second diffusion region, wherein edges of the drift well do not extend below the gate and is away from a channel region; and
    a drain well disposed under the second diffusion region and extends beyond the drift well.

13. The device of claim 12 wherein:
    the first device well comprises dopants of the first polarity type and the second device well comprises dopants of a second polarity type; and
    the first and second diffusion regions comprise dopants of a first polarity type.

14. The device of claim 13 wherein the first polarity type comprises n type and the second polarity type comprises p type.

15. The device of claim 12 wherein a first edge of the drift well is below a bottom of a device isolation region adjacent to the second diffusion region and a second edge of the drift well extends beyond the second diffusion region.

16. The device of claim 12 wherein the drain well underlaps a portion of the gate.

17. The device of claim 12 wherein the transistor is devoid of a drift isolation region disposed between the gate and the second diffusion region.

18. The device of claim 12 wherein the drift well is narrower than the drain well.

19. The device of claim 12 wherein the drain well is shallower than the drift well.

20. The device of claim 12 wherein the drain well comprises a width which is larger than a width of the second diffusion region.

* * * * *